United States Patent
August et al.

(10) Patent No.: US 10,036,667 B2
(45) Date of Patent: Jul. 31, 2018

(54) THIN-LAYERED DEVICES IN COMPRESSIVE SENSING SPECTROSCOPY

(71) Applicant: B. G. Negev Technologies and Applications Ltd., at Ben-Gurion University, Be'er Sheva (IL)

(72) Inventors: Yitzhak August, Beer-Sheva (IL); Adrian Stern, Omer (IL); Dan G. Blumberg, Beer-Sheva (IL); Stanley R. Rotman, Beer-Sheva (IL)

(73) Assignee: B. G. Negev Technologies and Applications Ltd., at Ben-Gurion University, Beer Sheva (IL)

( * ) Notice: Subject to any disclaimer, the term of this patent is extended or adjusted under 35 U.S.C. 154(b) by 25 days.

(21) Appl. No.: 14/904,440

(22) PCT Filed: Jul. 13, 2014

(86) PCT No.: PCT/IL2014/050630
§ 371 (c)(1),
(2) Date: Jan. 12, 2016

(87) PCT Pub. No.: WO2015/008276
PCT Pub. Date: Jan. 22, 2015

(65) Prior Publication Data
US 2016/0146667 A1 May 26, 2016

Related U.S. Application Data

(60) Provisional application No. 61/846,024, filed on Jul. 14, 2013.

(51) Int. Cl.
*G01J 3/00* (2006.01)
*G01J 3/433* (2006.01)
(Continued)

(52) U.S. Cl.
CPC ............ *G01J 3/433* (2013.01); *G01J 3/1256* (2013.01); *G01J 3/26* (2013.01); *H03M 7/3062* (2013.01)

(58) Field of Classification Search
CPC ............ G01J 3/433; G01J 3/1256; G01J 3/26; H03M 7/3062
(Continued)

(56) References Cited

U.S. PATENT DOCUMENTS

2006/0038705 A1 2/2006 Brady et al.
2008/0288225 A1* 11/2008 Djordjev .............. G02B 26/001
703/6

(Continued)

FOREIGN PATENT DOCUMENTS

| WO | WO 2006/116134 A2 | 11/2006 |
| WO | WO 2011/103601 A2 | 8/2011 |
| WO | WO 2013/003485 A1 | 1/2013 |

OTHER PUBLICATIONS

August et al. "Compressive hyperspectral imaging by random separable projections in both the spatial and the spectral domains" Applied optics. Apr. 1, 2013;52(10):D46-54.
(Continued)

*Primary Examiner* — Hina F Ayub
(74) *Attorney, Agent, or Firm* — Mark Cohen; Pearl Cohen Zedek Latzer Baratz LLP

(57) ABSTRACT

A spectroscopic method using either tunable or preset non-tunable thin-layered devices or a combination of both to modulate compressed-sensing-compliant, spectral modulations and to use intensity measurements of each respective spectral modulation to numerically reconstruct an estimated spectral distribution of the spectral signal such that the estimated spectral distribution is characterized by a totality
(Continued)

of spectral bands exceeding the number of spectral modulations by about one half an order-of-magnitude or more.

20 Claims, 10 Drawing Sheets

(51) Int. Cl.
*G01J 3/26* (2006.01)
*G01J 3/12* (2006.01)
*H03M 7/30* (2006.01)

(58) Field of Classification Search
USPC .......................................................... 356/300
See application file for complete search history.

(56) References Cited

U.S. PATENT DOCUMENTS

| | | | |
|---|---|---|---|
| 2010/0118064 A1* | 5/2010 | Salsman | G09G 3/3611 345/690 |
| 2011/0142339 A1 | 6/2011 | Singh et al. | |
| 2011/0228263 A1* | 9/2011 | Chuang | G01N 21/9501 356/300 |
| 2012/0038789 A1 | 2/2012 | Kelly et al. | |
| 2012/0038798 A1 | 2/2012 | Woods et al. | |
| 2012/0038819 A1 | 2/2012 | McMackin et al. | |
| 2012/0105962 A1* | 5/2012 | Fattal | G02B 5/08 359/575 |
| 2012/0188368 A1 | 7/2012 | Shechtman et al. | |
| 2013/0002968 A1* | 1/2013 | Bridge | H04N 5/232 348/744 |
| 2013/0083312 A1 | 4/2013 | Baraniuk et al. | |

OTHER PUBLICATIONS

Brady, D. J. "Optical imaging and spectroscopy" 2009, Wiley-OSA, pp. 382-383.

Bruckstein et al. "On the uniqueness of nonnegative sparse solutions to underdetermined systems of equations" IEEE Transactions on Information Theory. Nov. 2008;54(11):4813-20.

Candes et al. "Sparsity and incoherence in compressive sampling" Inverse problems. Apr. 10, 2007;23(3):969.

Candés et al. "An introduction to compressive sampling. IEEE signal processing magazine" Mar. 2008;25(2):21-30.

Donoho DL. "Compressed sensing" IEEE Transactions on information theory. Apr. 2006;52(4):1289-306.

Elad M. "Optimized projections for compressed sensing" IEEE Transactions on Signal Processing. Dec. 2007;55(12):5695-702.

Elad, M. "Sparse and redundant representations" 2010, Springer, Ch. 4 pp. 55-77, Ch. 6 pp. 111-136, Ch. 8 pp. 153-166.

Eldar, Y. C. and G. Kutyniok "Compressed Sensing: Theory and Applications" 2012, Cambridge University Press Cambridge, pp. 38-24, 269-347 and 348-393.

European Search Report for European Application No. 14825655.5 dated Jul. 7, 2017.

Foucart, S. and H. Rauhut "A Mathematical Introduction to Compressive Sensing", 2013, Springer, pp. 61-110.

International Search Report for PCT Application No. PCT/IL2014/050630 dated Nov. 18, 2014.

Ramo, S., J. R. Whinnery and T. Van Duzer "Fields and waves in communication electronics", 1994, John Wiley & Sons, pp. 710-711.

Saleh, B. E. and M. C. Teich "Fundamentals of photonics", 2007, Wiley-Interscience, Ch. 6 pp. 232-235, Ch. 7 pp. 254-257, Ch. 10 pp. 367-378, Ch. 20 pp. 856-861.

Slavinsky et al. "The compressive multiplexer for multi-channel compressive sensing" In Acoustics, Speech and Signal Processing (ICASSP), 2011 IEEE International Conference on May 22, 2011 (pp. 3980-3983). IEEE.

Stern et al. "Random projections imaging with extended space-bandwidth product" Journal of Display Technology. Sep. 2007;3(3):315-20.

Wagadarikar et al. "Single disperser design for coded aperture snapshot spectral imaging" Applied optics. Apr. 1, 2008;47(10):B44-51.

\* cited by examiner

THIN-LAYERED DEVICES IN COMPRESSIVE SENSING SPECTROSCOPY

CROSS-REFERENCE TO RELATED APPLICATIONS

This application is a National Phase Application of PCT International Application No. PCT/IL2014/050630, International Filing Date Jul. 13, 2014, claiming priority of U.S. provisional Patent Application No. 61/846,024, filed Jul. 14, 2013, which is hereby incorporated by reference.

BACKGROUND AND FIELD OF THE INVENTION

The present invention relates generally to spectroscopy, and specifically, relates to Tunable, Thin-Layered Devices (TTLD) in a manner compliant with Compressive Sensing (CS) for spectroscopy.

As is known, traditional spectroscopy typically obtains spectral information at narrow spectral bands and obtained through various diffractive, dispersive, or narrow-band filter techniques.

In certain applications, such measurement schemes can make data acquisition time consuming and resource expensive.

The measurement burden may be reduced by employing compressive sensing spectroscopy by multiplexing spatially converted spectral signal to recover number of spectral bands exceeding the number of measurement with algorithms prescribed by CS theory.

However, compressive spectral imaging techniques based on spatial modulation suffer from power losses, can be relatively cumbersome, and complex to operate.

Therefore, it would be advantageous to employ CS techniques spectroscopy systems in which the multiplexing is performed entirely in the spectral domain.

SUMMARY OF THE INVENTION

According to the teachings of the present invention there is provided a spectroscopic method including using one or more thin-layered photonic devices to modulate a plurality of spectral modulations from a spectral signal, each spectral modulation characterized by at least two peaks when depicted in a modulated transmission or reflection response; obtaining one intensity measurement from each of the spectral modulations, using a processor to numerically resolve an estimated spectral distribution of the spectral signal from the intensity measurements, the estimated spectral distribution characterized by a totality of spectral bands exceeding in number the plurality of spectral modulations.

According to a further feature of the present invention, the one or more thin-layered photonic devices includes non-tunable photonic devices.

According to a further feature of the present invention, the one or more thin-layered photonic devices includes a tunable single-cell liquid-crystal-retarder.

According to a further feature of the present invention, the using one or more thin-layered photonic devices to modulate a plurality of spectral modulations, includes adjusting a voltage applied to the liquid-crystal-retarder.

According to a further feature of the present invention, the adjusting a voltage applied to the liquid-crystal-retarder is implemented in increments between 0.001 volts-to 0.5 volts.

According to a further feature of the present invention, the one or more thin-layered photonic devices includes a tunable reflection-based thin-layered photonic device having a plurality of partially-reflective layer having a reflectivity ranging between about 70%-95%.

According to a further feature of the present invention, the one or more thin-layered photonic devices includes a tunable, reflection-based thin-layered photonic device having a plurality of partially-reflective layers having reflectivity ranging between about 80%-90%.

According to a further feature of the present invention, the using one or more tunable, reflection-based thin-layered photonic devices to modulate a plurality of spectral modulations from a spectral signal, includes adjusting a distance between the partially-reflective layers.

According to a further feature of the present invention, the adjusting a distance between the partially-reflective layers is implemented in increments of 0.1 µm According to the teachings of the present invention there is provided using one or more, thin-layered photonic devices to modulate a plurality of spectral modulations from a spectral signal, the spectral modulations characterized by a mutual coherence enabling numerical reconstruction of an estimated spectral distribution of the spectral signal, the estimated spectral distribution characterized by a totality of spectral bands exceeding the plurality of modulations; obtaining one intensity measurement from each of the spectral modulations; and using a processor to numerically resolve an estimated spectral distribution of the spectral signal from the intensity measurements, the estimated spectral distribution characterized by a totality of spectral bands exceeding in number the plurality of spectral modulations.

According to a further feature of the present invention, the one or more thin-layered photonic devices includes non-tunable photonic devices.

According to a further feature of the present invention, the one or more photonic devices includes a tunable single-cell liquid-crystal-retarder.

According to a further feature of the present invention, the using one or more photonic devices to modulate a plurality of spectral modulations, includes adjusting a voltage applied to the liquid-crystal-retarder.

According to a further feature of the present invention, one or more photonic devices includes a reflection-based, photonic device having at least one partially-reflective layer having a reflectivity ranging between about 75%-95%.

According to a further feature of the present invention, the one or more photonic devices includes a tunable reflection-based, photonic device having at least one partially-reflective layer having a reflectivity ranging between about 80%-90%.

According to a further feature of the present invention, the using one or more photonic devices to modulate a plurality of spectral modulations, includes adjusting a distance between the partially-reflective layers.

According to the teachings of the present invention there is provided one or more thin-layered photonic devices operative to modulate a plurality of spectral modulations from a spectral signal, each spectral modulation having a spectral range characterized by a plurality of peaks in a modulated transmission or reflection response; an intensity sensor operative to obtain one intensity measurements from the spectral modulations, a processor configured to numerically resolve an spectral distribution of the spectral signal from the intensity measurements, the estimated spectral distribution characterized by a totality of spectral bands exceeding in number the plurality of spectral modulations.

According to a further feature of the present invention, the one or more photonic devices are implemented in parallel.

According to a further feature of the present invention, the one or more photonic devices include a tunable single-cell liquid-crystal-retarder.

According to the teachings of the present invention there is provided a spectroscopic measuring device including: one or more, thin-layered photonic devices operative to modulate a plurality of spectral modulations from a spectral signal, each spectral modulation having a spectral range characterized by a plurality of peaks in a modulated transmission or reflection response; an intensity sensor operative to obtain one intensity measurements from the spectral modulations, a processor configured to numerically resolve an estimated spectral distribution of the spectral signal from the intensity measurements, the estimated spectral distribution characterized by a totality of spectral bands exceeding in number the plurality of spectral modulations.

According to a further feature of the present invention, the one or more photonic devices are implemented in parallel.

According to a further feature of the present invention, the one or more photonic devices include a tunable single-cell liquid-crystal-retarder.

According to a further feature of the present invention the one or more photonic devices include reflection-based photonic device having a plurality of partially-reflective layers of a reflectivity ranging between about 80%-90%.

According to a further feature of the present invention, the one or more reflection-based photonic devices are implemented in series.

According to a further feature of the present invention, there is also provided a display device configured to display graphically the spectral distribution of the spectral signal.

BRIEF DESCRIPTION OF THE DRAWINGS

The subject matter regarded as the invention is particularly pointed out and distinctly claimed in the concluding portion of the specification most clearly understood in view of the accompanying drawings in which:

Figure 1:
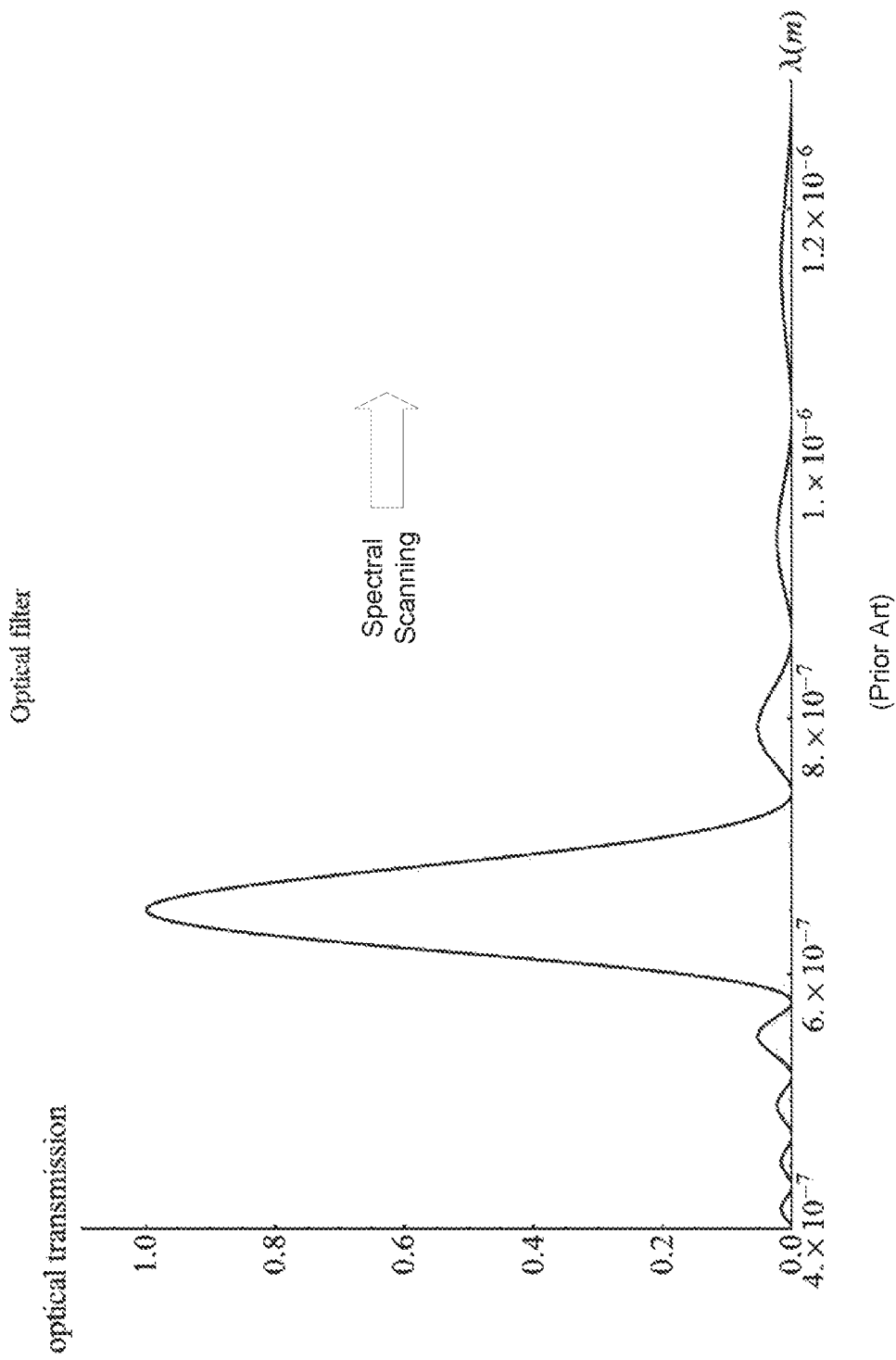
FIG. 1 is a spectral response of a three stage, narrow band filter of traditional spectral scanning techniques.

It will be appreciated that for simplicity and clarity, figure elements may not be been drawn not to scale and reference numerals may be repeated to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. Furthermore, well-known methods, procedures, and components have not been described in detail so as not to obscure the present invention. The present invention relates to the use of tunable, thin-layered devices in a CS compliant manner for spectroscopy.

Specifically, it relates to producing CS compliant modulations of a spectral signal that can be used to numerically reconstruct the original spectral signal with a band resolution far exceeding the number of optical measurements obtained from the CS compliant modulations.

The following terms will be used throughout the document.

"Tunable, thin-layered devices, (TTLD)" refers to a class of photonic devices having a stack of electro-optical layers configured to alter the spectral characteristics of light.

"Tunable" refers to a capacity to change optical properties like transmission, reflection or polarization, for example. In Liquid Crystal (LC) embodiments the tunability may be achieved through changing voltage applied to the LC cell whereas in reflection-based embodiments tunability is achieved by changing the thickness of a dielectric layer disposed between partially reflecting layers, for example.

It should be appreciated that in some embodiments, the outer layers or a plurality of inner layers are also tunable.

The tunable layer ranges in thickness between about 1 micron to 4 mm depending on the implementation spectral range as will be further discussed.

The tunable layer may be constructed from materials including, inter alia, dielectric and non-metallic conducting materials, polarizing materials, liquid crystal, and metal.

"Thin-layered" refers to the optical or electro-optical element polarizing light passing through the photonic device. Typically, in liquid-crystal photonic devices these layers have a thickness about 10 to 100 times the greatest wavelength of the spectral range being measured, according to an embodiment. Typically, in modified Fabry-Perot photonic devices the optically active layers have a thickness of about 100 to 1000 times the greatest wavelength of the spectral range being measured, according to an embodiment.

TTL devices are tunable in that their modulation behavior is defined through adjustment of any one or combination of an optical characteristic, geometry, or width of one or more of the layers. The TTL devices are further characterized by their ability to generate a spectral response having multiple peaks within a spectral range to be measured.

"Modulated spectral response" refers to a spectral response defined by a tunable, thin-layered device operating in accordance with chosen modulation parameters.

"Spectral response" refers to the ratio between the output intensity to the input intensity as a function of wavelength.

"Display device" refers to a visual or a textual display device, for example.

Turning now to the figures, FIG. 1 depicts a spectral response of a narrow band filter, like a three stages Lyot filter, during serial scanning of a full spectral range during traditional spectroscopic measurement operations.

Figure 2:
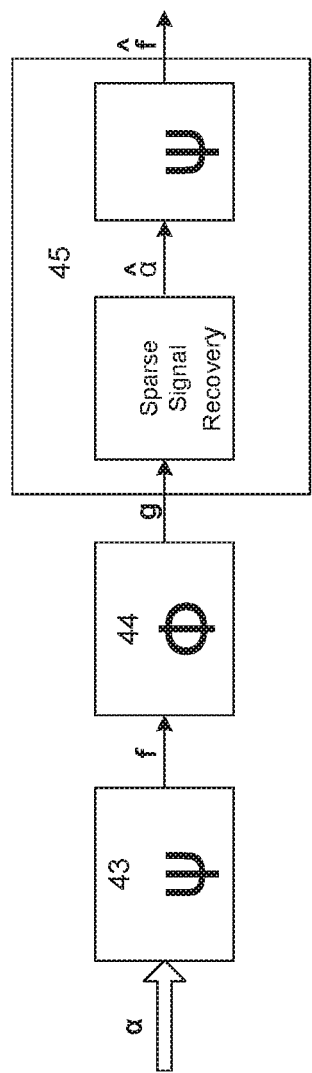
FIG. 2 is flow diagram of steps employed in compressive sensing, according to an embodiment.

FIG. 2 depicts a flow diagram of CS technique used to recover sparse signals from significantly fewer measurements than those needed according to traditional sampling theory.

In step 43, f represents a physical signal, e.g. input spectral signal and α represents a vector of components in the sparsifying domain used to represent f. In general, α is a mathematical representation vector that contains mainly zeros or near zero values or a sparse vector.

In the spectral acquisition step 44, the physical signal vector f, is sampled using the Φ operator (Φ is also called the compressive sensing operator), yielding the measurement vector g.

In the final step 45, signal reconstruction is accomplished by estimating of f using $l_1$ type minimization with some regularization penalty function or operator.

It is assumed that an N×1 physical signal vector, f, that is to be measured can be expressed by f=Ψα, where the N×1 vector, α, contains only k<<N non-zero elements and Ψ is a sparsifying operator that dependent in the physical mechanism of f.

The measurements vector g∈M×1, is obtained by g=Φf where Φ∈M×N is a sensing matrix.

By properly choosing M and Φ, and assuming sparsity of f in the domain of Ψ, there is a guaranty that the signal f can be recovered from the g measurements.

Therefore a physical and optical sensing matrix is built, Φ, such that it enables accurate recovery of an N-sized f from fewer M measurements, g.

Reconstruction of f from g is guaranteed if the number of measurements, M, meets the following condition:

$$M \geq C\mu^2 K \log(N)$$

It can be seen that the number of measurements required, M, depends on the logarithm of the size of the signal, N, its sparisity, k, and μ, representing the mutual coherence between Φ and Ψ. The mutual coherence it is defined by:

$$\mu(\Phi, \Psi) = \sqrt{N} \max_{1 \leq i,j, \leq m} |\langle \Phi_i, \Psi_j \rangle|.$$

where $\Phi_i$, $\Psi_j$ are vectors of Φ and Ψ, respectively. The value of μ is in the range of $1 \leq \mu \leq \sqrt{N}$. The lower μ is, the better is the performance of the system.

The original signal, f, can be recovered by solving methods used in the Compressive Sensing theory. A common recovering approach is by formulating a convex problem with regularization penalty such as:

$$\hat{f} = \Psi\hat{\alpha}; \hat{\alpha} = \min_{\alpha}\{\|g - \Phi\Psi\alpha\|_2^2 + \gamma\|\alpha\|_1\}.$$

wherein $\|\alpha\|_1$ is $l_1$ norm and γ is a regularization weight.

Figure 3:
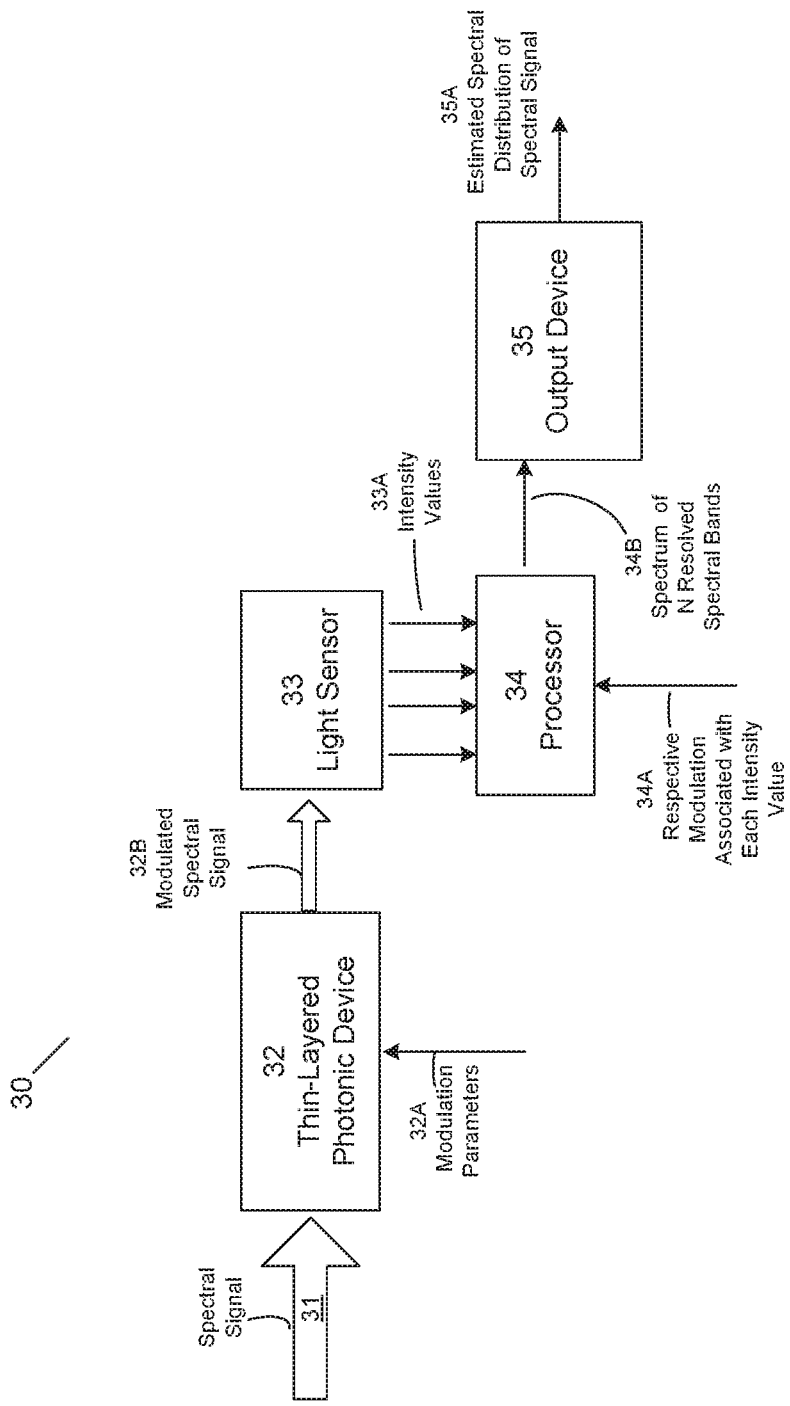
FIG. 3 is block-flow diagram depicting the use of TTLD in spectroscopy, according to an embodiment.

FIG. 3 is block-flow diagram of TTLD based spectroscopy system 30 including at least one thin-layered-device 32 configured to modulate spectral signal 31 in a CS compliant manner in accordance with modulation parameters 32A, a light detector 33 for measuring intensity of modulated spectral signal 32B, a processor 34 or computer for numerically reconstructing a spectral response from measured intensity values 33A, a graphical display 35 for graphically displaying numerically constructed estimated spectral distribution 35A of spectral signal 31.

TTLD 32 is implemented in certain embodiments as a single-cell, Tunable Liquid-Crystal-Retarder (LCR) and in other non-limiting embodiments, as a Reflection-Based, Tunable Thin-Layered Device (RBTTLD). It should be noted that LCRs may be implemented in any one or combination of nematic, schematic, or chiral forms of liquid crystal.

Regarding multiple device linked together, it should be appreciated that RBTTLD embodiments may be linked in series so that a first modulation of spectral signal 31 is re-modulated by each consecutive TTL device 32, or may be linked in parallel so as to spectrally modulate spectral signal 31 in parallel. LCR embodiments may be linked to work together in parallel, according to an embodiment.

In certain embodiments in which a plurality of TTL devices are linked in parallel and each is fitted with its respective light sensor, tuning is implemented simultaneously when each of the TTL devices is tuned differently.

Furthermore, it should be noted that all directions of input of spectral signal 31 and output of spectral modulated signal 32B are also included within the scope of the present invention.

Similarly, in a certain embodiment thin-layered device (TLC) 32 is implemented as a plurality of non-tunable, thin-layered phonic devices; each preset to modulate in accordance with a CS compliant manner.

Modulation increments are set in accordance with the number measurements to be taken so that the number of modulations is an order-of-magnitude less than the number of spectral bands to be estimated, in a certain embodiment.

In another embodiment, the modulation increments are set so as to minimize mutual coherence as is known those skilled in the art.

It should be appreciated that in a certain embodiment TTLD 32 implemented as part of the illumination source to produce structured or modulated illumination for object illumination to obtain a modulated spectral signal 32B is included within the scope of the invention. The use of structured illumination to replace multiple modulations is implemented in accordance with Helmholtz reciprocity and "dual photography" [Sen, Pradeep, et al. "Dual photography." ACM Transactions on Graphics (TOG) 24.3 (2005): 745-755.]

Figure 3A:
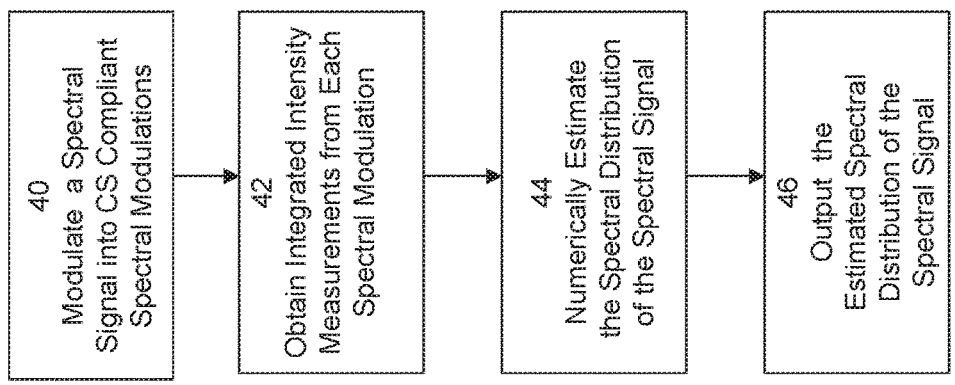
FIG. 3A is a flow diagram depicting the operation of TTLD spectroscopy system in a CS-compliant manner, according to an embodiment.

FIG. 3A is a flowchart depicting steps employed to obtain estimated spectral distribution 35A of spectral signal 31 using TTLD in a CS compliant manner.

In view of FIG. 3, at step 40 spectral signal 31 passing through thin, tunable device 32 is modulated by changing modulation parameters 32A in accordance with CS practice, as noted above. In this manner, a physical mechanism is provided to set the transmission behavior of the tunable, thin-layered device 32 so as to encode spectral components and to define spectral vector projection in modulated spectral signal 32B. It should be appreciated that the adjustment of modulation parameters 32A to modulate spectral signal 31 may be accomplished either in an automated manner or manually.

The particular modulation parameters 32A used to modulate spectral signal 31 are the parameters appropriate for the particular implementation of thin-layered device 32. For example, when implemented as an LC device, modulation parameters 32A include voltage whereas in reflection-based implementations, modulation parameters 32A include the proximity between partially reflective surfaces, as will be further discussed.

It should be appreciated that alternative modulation parameters 32 include inter alia, geometrical parameters, pressure, temperature, and refractive index and may be modulated independently or in combination with each other to achieve the desired modulated spectral response.

At step 42 light sensor 33 measures the entire transmitted intensity of each modulated signal 32B in accordance with $$g_i = \int f(\lambda) T_i(\lambda) d\lambda$$

wherein:
$g_i$ is the measured intensity of the i'th measurement,
$f(\lambda)$ is the input spectral signal, and
$T_i(\lambda)$ is the modulated transmission or reflection for the i'th measurement At step 44, intensity values 33A in conjunction with each respective modulation are processed by processor 34 or a computer in accordance with an algorithm to numerically reconstruct or transmission or reflectance values as a function of wavelength so as to form an estimated spectral distribution of spectral signal 31.

Non-limiting examples of such algorithms include, inter alia, Dantzig-Selector Algorithm, Iterative-Shrinkage Algorithms, and Pursuit Algorithms and are well known to those skilled in the art. Additional algorithms may be found in references like:

"*Sparse and Redundant Representations: From Theory to Applications in Signal and Image Processing*", by M. Elad, DOI 10.1007/978-1-4419-7011-4_3, © Springer Science+Business Media, LLC 2010, "*Compressed Sensing: Theory and Applications*", by Eldar, Yonina C., and Gitta Kutyniok, Cambridge: Cambridge University Press, 2012, and "*A Mathematical Introduction to Compressive Sensing*", by Foucart, Simon, and Holger Rauhut, Berlin: Springer, 2013.

In step 46, the estimated spectral distribution of spectral signal 31 is displayed graphically by output device 35, according to non-limiting embodiments.

Figure 4:
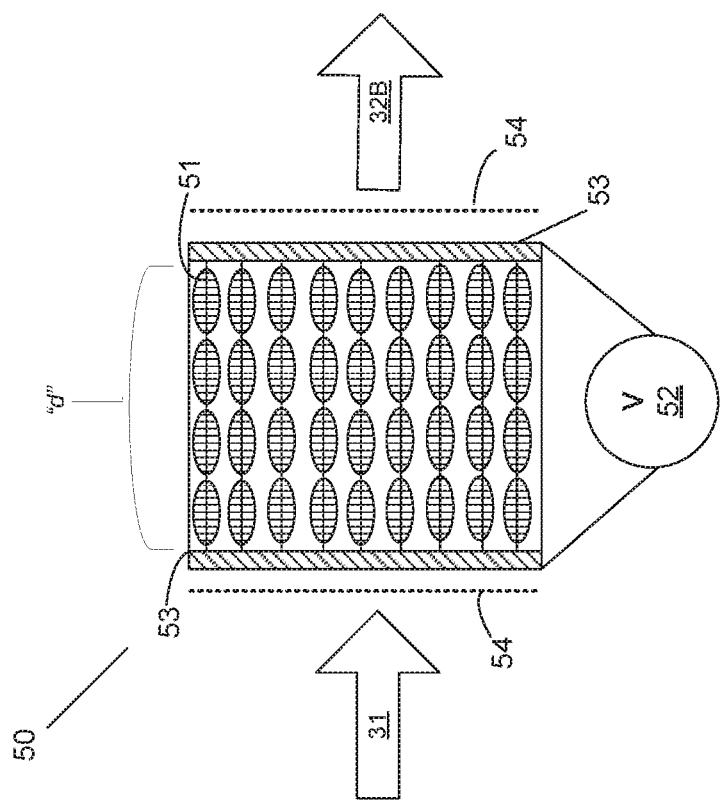
FIG. 4 is a schematic view of a single-cell liquid-crystal-retarder embodiment of a tunable, thin-layered device, according to an embodiment.

FIG. 4 is a schematic diagram of a TTLD implemented as a single-cell, liquid-crystal-retarder 50 in which a stack of electro-optical layers is formed by a layer of liquid crystal 51 sandwiched in between two transparent electrodes 53 in turn disposed between polarizers 54.

In certain embodiments liquid crystal 51 has a thickness ranging between about 10-100 microns; less than the collective thickness of typical LC embodiments used for spectrometry implemented as a plurality of cells linked in series.

Surprisingly, a single-cell liquid-crystal-retarder provides CS-compliant modulation needed to numerically resolve an estimated spectral distribution of a spectral signal characterized by a totality of spectral bands exceeding the number of spectral modulations.

Spectral signal 31 is modulated into modulated spectral signal 32B as a function of changes in voltage supplied by variable voltage supply 52 ranging between 0.0-15.0 volts. In certain embodiments, the voltage increments in a first voltage range are different than the increments in a second voltage range. For example, between 0.0-3.0 volts the applied voltage changed in increments of 0.05 volts whereas in the range between 3.0-10.0 volts the voltage changed in increments of 0.1 volts.

Considering theoretical results for spectroscopic system 30 (FIG. 3) employing single-cell liquid-crystal-retarder 50, the sensing matrix $\Phi_{LC}$ can be modeled as:

$$\phi_{ij} = \frac{1}{2}\cos\left[\frac{\pi d(n_i - n_o)}{\lambda_j}\right]^2 = \frac{1}{2} + \frac{1}{2}\sin\left[\frac{\pi d \Delta n_i}{\lambda_j}\right].$$

Wherein:
"$\Delta n_i$" is the difference between the extraordinary and the ordinary refraction index of liquid crystal 51 at the device state "i",
"d" is the cell length, and
"c" is the speed of light.

As is known to those skilled in the art, the above system matrix exhibits a harmonic behavior which is one of the favorite sensing operators in CS practice and exhibits a biased (by ½) harmonic, therefore it has only non-negative values.

Measurements of modulated signal 32B nematic liquid crystal device used to build the sensing matrix $\Phi_{LC}$ and the equation $$\hat{f} = \Psi \hat{\alpha}; \hat{\alpha} = \min_{\alpha} \{\|g - \Phi \Psi \alpha\|_2^2 + \gamma \|\alpha\|_1\}.$$

solved to produce the N dimensional vector representing the spectrum of N resolved spectrum bands.

Figure 4A:
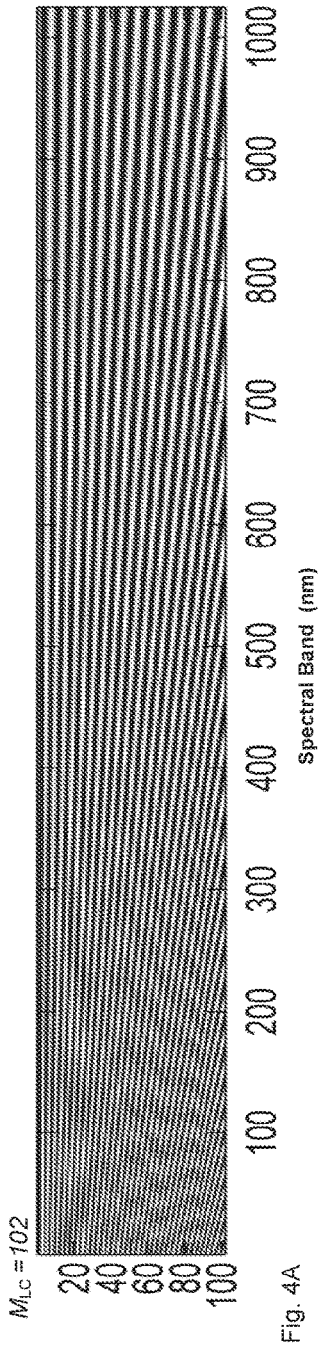
FIG. 4A is an image plot of the system matrix representing the compressive sensing operator Φ shown in FIG. 2 of the single-cell liquid-crystal-retarder of FIG. 4, which can be viewed as stack of MLC=102 spectral modulation according to an embodiment.

FIG. 4A is an image plot of $M_{LC}$ modulating functions wherein each row corresponds to row "i" of compressive sensing operator $\Phi_{ij}$ noted above. The image plot is derived from 102 spectral modulations of spectral signal 31, and 1024 spectral bands, of 0.4 nm each, according to a non-limiting embodiment.

Figure 4B:
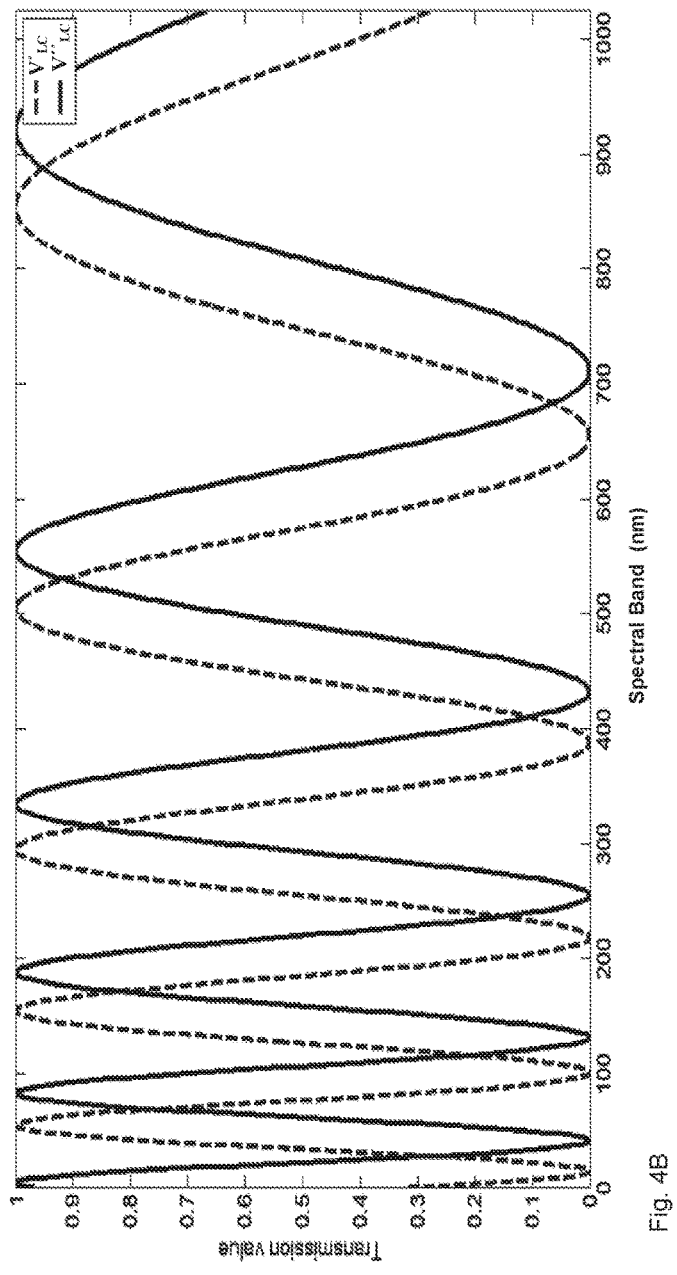
FIG. 4B depicts two modulated transmission behaviors of the liquid-crystal-retarder of FIG. 4, according to an embodiment.

FIG. 4B depicts two modulated transmission responses $V'_{LC}$ and $V''_{LC}$ derived from chosen modulations from the modulation stack of FIG. 4A. $V''_{LC}$ and $V''_{LC}$ are each indicative of transmission behavior of the LC device 50 for its respective modulation parameters.

Figure 5A:
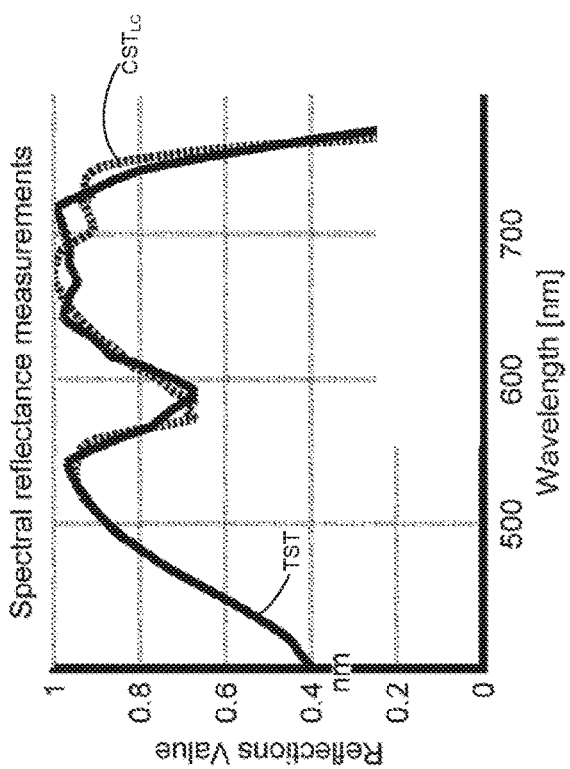
FIGS. 5 and 5A depict comparative spectra, one derived from CS-compliant spectral modulation using a liquid-crystal based spectroscopy system and the other derived from traditional, scan-based spectroscopy system, according to an embodiment.
Figure 5:
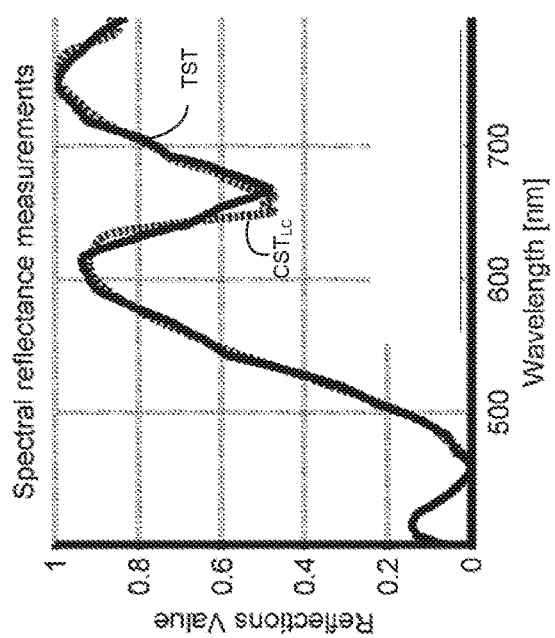

As shown, modulations $V'_{LC}$ and $V''_{LC}$ are CS compliant in that each is characterized by at least two peaks spanning the spectral bands of interest; in this non-limiting example, the spectral bands of interest are included within the range of zero to a thousand nanometers. Furthermore, modulations $V'_{LC}$ and $V''_{LC}$ have a low correlation in that there is there is minimal overlap between the modulating functions FIGS. 5A and 5B depict comparative biogenic-crust spectra; $CST_{LC}$ and TST within a spectral range of 400-810 nm. Spectral response $CST_{LC}$ is obtained through CS techniques in conjunction with a LC device as described above whereas spectral response TST is derived from traditional, scan-based spectroscopy techniques.

Spectral response $CST_{LC}$ substantially traces the TST and resolves 1024 spectrum bands of 0.4 nm each for reconstructed signal obtained from a mere $M_{LC}$=102 intensity measurements obtained with the stack of modulating transmissions shown above in FIG. 4A.

Figure 6:
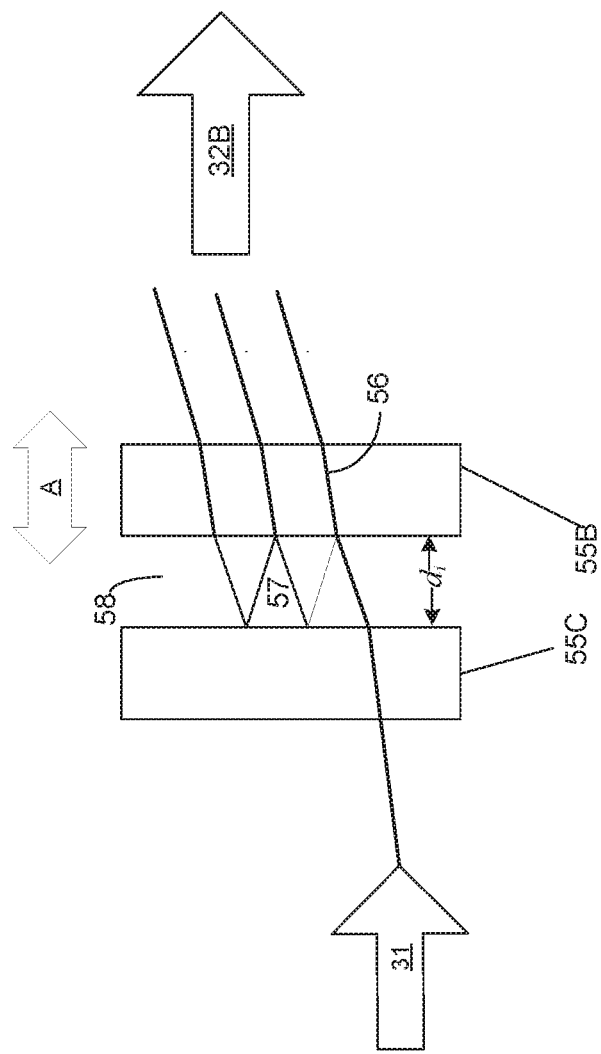
FIG. 6 is a schematic view of a reflection-based embodiment of a tunable, thin-layered device, according to an embodiment.

FIG. 6 depicts a schematic view of a reflection-based embodiment of a TTLD in which a stack of electro-optical layers is formed by partially-reflecting layers 55B and 55C sandwiching middle layer 57, according to a non-limiting embodiment.

Tunable layer 57, is implemented as air, partially-reflecting layers 55B and 55C are configured to be proximity variant in 0.1 μm increments, as shown by arrow "A", within a range "d" between about 50 μm to 4 mm, according to some embodiments. Partially-reflecting layers 55B and 55C may each have thickness of about 3.0 nm to 20.0 nm and reflectance of about R=0.8-0.9 in certain embodiments, and in other embodiments 0.75-0.95. (The partial reflection of layer 55C is not shown.)

In contrast to Fabry-Perot type interferometers having a reflection approaching 100% and a gap between reflecting plates of about 5.0 cm, the relatively low reflection and thin tunable layer 58 of the present invention surprisingly provide CS-compliant modulations needed to numerically resolve an estimated spectral distribution of a spectral signal characterized by a totality of spectral bands exceeding the number of spectral modulations.

It should be appreciated that middle layer 57 implemented as a plurality of sub-layers or implemented as a piezoelectric crystal capable of providing a change in modulation behavior responsively to changes in voltage. In certain embodiments, voltage may be applied between 0.0-80.0 volts and may be changed in increments as noted above.

Considering a reflectance of R=0.8, each transmission modulation 32B is given by:

$$T_i(\lambda_j) = \frac{0.04}{1.64 - 1.6\cos\left(\frac{4\pi n d_i}{\lambda_j}\right)},$$

wherein "R" is the reflectance of partially reflective layer 55B,

"$\lambda_j$" is wavelength of spectral band "j",

"n" is the refractive index, and

"$d_i$" is the distance between the reflecting layers.

The "i, j" element of "$T_i(\lambda_j)$" represents the "i, j" element of sensing matrix Φ noted above such that $\phi_{ij}$, the element in the i row of matrix Φ at position j, i.e. the transmission for $\lambda_j$ in device state i.

Figure 6A:
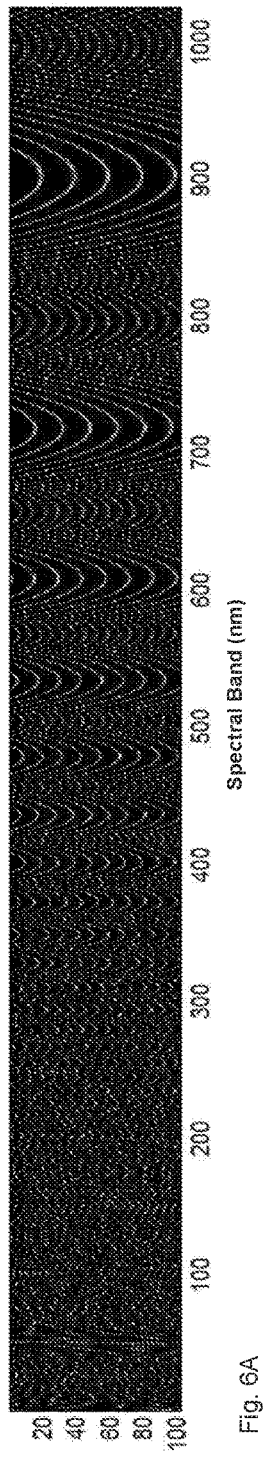
FIG. 6A is an image plot of a modulation transmission stack of a reflection-based embodiment of a tunable, thin-layered device of FIG. 6, according to an embodiment.

FIG. 6A shows an image plot of transmission modulations, $T_i(\lambda_j)$ where rows i=1, . . . M is the modulations index, and j=1, . . . N is the spectral bend index of spectral signal 31 for each incremental change in distance between reflecting layers 55. In this reflection-based embodiment, 102 intensity measurements were obtained, one for each modulation of spectral signal 31.

In this reflection-based embodiment, 102 intensity measurements were obtained, one for each modulation of spectral signal 31.

Figure 6B:
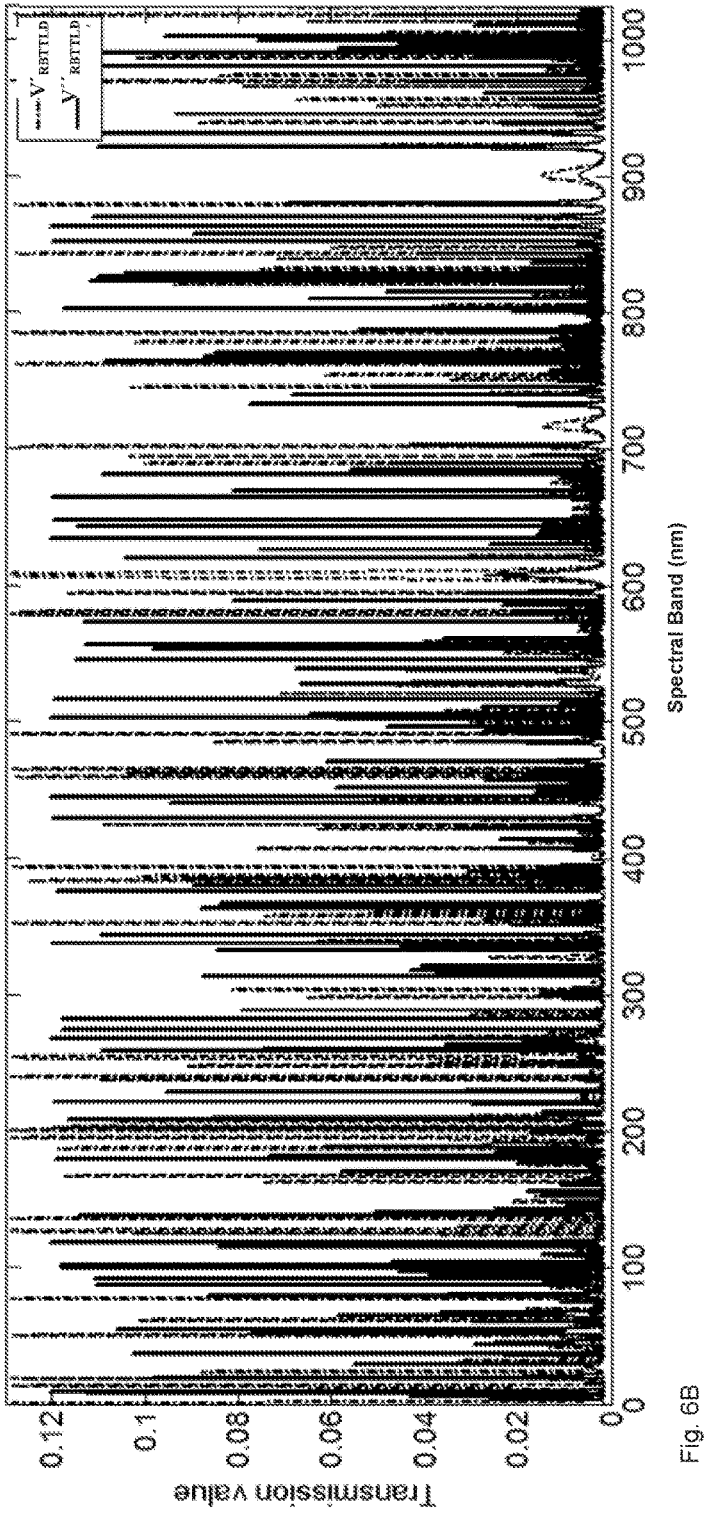
FIG. 6B depicts two transmission behaviors of reflection-based embodiment of the thin, tunable-layered for respective parameter of the device of FIG. 6, according to an embodiment.

FIG. 6B depicts two modulated transmission responses, V'$_{RBTTLD}$ and V''$_{RBTTLD}$, depicting transmission behavior of a Reflection-Based, Tunable Thin-Layered Device (RBTLLD) derived from two of the 100 separate modulations ($M_{RBTTLD}$) shown in FIG. 6A. As is known to those skilled in the art, V'$_{RBTTLD}$ and V''$_{RBTTLD}$ are indicative of transmission behavior of the RBTTLD 50 for respective distances between reflective layers 55.

As shown, RBTLLD behavior also exhibits multiple weighted spectral transmission windows of different sizes, non-uniformly spread over the measurement spectrum range as required by CS practice.

Figure 7:
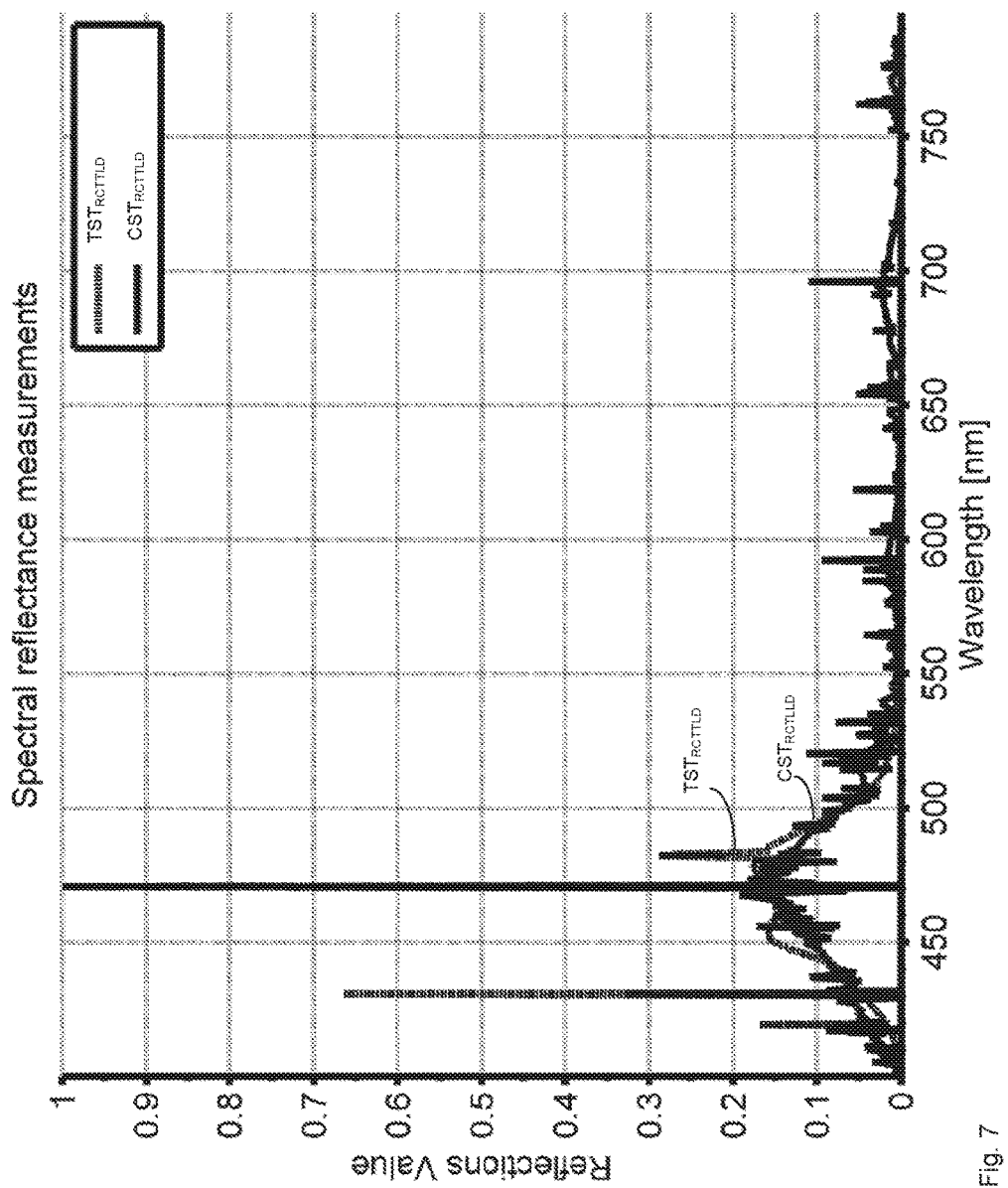
FIG. 7 are comparative spectra, one derived from CS-compliant spectral modulation using a reflection-based TTLD and the other one derived from traditional, scan-based spectroscopy system, according to an embodiment.

FIG. 7 depicts comparative spectral responses for CST$_{RBTTLD}$ and TST within a spectral range of 400-800 nm. Spectral response CST$_{RBTTLD}$ is obtained through CS techniques in conjunction with Reflection-Based, Thin Tunable-Layered Device (TTLD) whereas TST is derived from traditional scan-based spectroscopy techniques.

As shown, spectral response CST$_{RBTTLD}$ substantially traces spectral response TST and resolves 1024 spectrum bands of 0.4 nm each for reconstructed signal obtained from a mere $M_{RBTTLD}$=100 intensity measurements as shown above in FIG. 6A.

The use of Tunable Thin-Layered Devices in conjunction with compressed sensing techniques provides numerous benefits lacking in conventional spectroscopic and spatially-based CS methods. Specifically, the resulting reduction of measurements facilitates:

Reduction of the number and the size of detectors,

Reduction of system size and complexity,

Reduction of system costs,

Reduction of noise,

Reduction of power loss,

Reduction of acquisition time, and

Enhancement of ultra-resolution-spectral acquisition.

Applications of the herein described method include, inter alia, multispectral and hyperspectral imaging in which pixel, spectral information is spatially distributed and also applications in which compressive sensing is performed in the spatial domain prior to spectral decomposition using either structured or un-structured light for specimen or sample illumination.

It should be appreciated that that the above described method can be applied for various spectral ranges spanning frequencies associated with IR and UV into the THz range, for example. In principle, the thickness of the tunable layer of modulation devices scales linearly with the wavelength being modulated. For example, the width of the tunable layer used for IR having a wavelength of about 3.0-5.0 microns is about ten times larger than the thickness of a tunable layer used for visible spectrum having a wavelength of about 0.5 microns.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A spectroscopic method comprising:

spectrally modulating a non-spatially modulated spectral signal so as to generate a plurality of spectral modulations through one or more tunable thin-layered photonic devices, each of the spectral modulations characterized by at least two peaks when depicted in a modulated transmission or reflection response on a display device;

obtaining one intensity measurement from each of the spectral modulations; and using a processor to numerically resolve an estimated spectral distribution of the spectral signal from the intensity measurements, the estimated spectral distribution characterized by a totality of spectral bands exceeding in number the plurality of spectral modulations.

2. The spectroscopic method of claim 1, wherein the one or more thin-layered photonic devices includes non-tunable photonic devices.

3. The spectroscopic method of claim 2, wherein the one or more thin-layered photonic devices includes a tunable, single-cell liquid-crystal-retarder.

4. The spectroscopic method of claim 3, wherein using one or
more thin-layered photonic devices to modulate a plurality of spectral modulations includes adjusting a voltage applied to the liquid-crystal-retarder.

5. The spectroscopic method of claim 4, wherein the adjusting
a voltage applied to the liquid-crystal-retarder is implemented in increments between
0.001 volts-to 0.5 volts.

6. The spectroscopic method of claim 1, wherein the one or more thin-layered photonic devices includes a tunable reflection-based thin-layered photonic device having a plurality of partially-reflective layer having a reflectivity ranging between about 70%-95%.

7. The spectroscopic method of claim 1, wherein the one or more thin-layered photonic devices includes a tunable, reflection-based thin-layered photonic device having a plurality of partially-reflective layers having reflectivity ranging between about 80%-90%.

8. The spectroscopic method of claim 7, wherein the using one or more tunable, reflection-based thin-layered photonic devices to modulate a plurality of spectral modulations from a spectral signal includes adjusting a distance between the partially-reflective layers.

9. The spectroscopic method of claim 8, wherein the adjusting
a distance between the partially-reflective layers is implemented in increments of 0.1 µm.

10. A spectroscopic method comprising:
spectrally modulating a non-spatially modulated spectral signal so as to generate a plurality of spectral modulations through one or more tunable thin-layered photonic devices, the spectral modulations characterized by a mutual coherence enabling numerical reconstruction of an estimated spectral distribution of the spectral signal, the estimated spectral distribution characterized by a totality of spectral bands exceeding the plurality of modulations;
obtaining one intensity measurement from each of the spectral modulations; and
using a processor to numerically resolve an estimated spectral distribution of the spectral signal from the intensity measurements, the estimated spectral distribution characterized by a totality of spectral bands exceeding in number the plurality of spectral modulations.

11. The spectroscopic measurement method of claim 10, wherein the one or more thin-layered photonic devices includes non-tunable photonic devices.

12. The spectroscopic measurement method of claim 10, wherein the one or more photonic devices includes a tunable single-cell liquid-crystal-retarder.

13. The spectroscopic method of claim 12, wherein the using one
or more photonic devices to modulate a plurality of spectral modulations, includes adjusting a voltage applied to the liquid-crystal-retarder.

14. The spectroscopic method of claim 10, wherein the one or more photonic devices includes a reflection-based, photonic device having at least one partially-reflective layer having a reflectivity ranging between about 75%-95%.

15. A spectroscopic measuring device comprising:
one or more tunable thin-layered photonic devices operative to spectrally modulate a plurality of spectral modulations from a non-spatially modulated spectral signal, each spectral modulation having a spectral range characterized by a plurality of peaks in a modulated transmission or reflection response;
an intensity sensor operative to obtain one intensity measurements from the spectral modulations; and
a processor configured to numerically resolve a spectral distribution of the spectral signal from the intensity measurements, the spectral distribution characterized by a totality of spectral bands exceeding in number the plurality of spectral modulations.

16. The spectroscopic measuring device of claim 15, wherein the one or more photonic devices are implemented in parallel.

17. The spectroscopic measuring device of claim 15, wherein the one or more photonic devices include a tunable single-cell liquid-crystal-retarder.

18. The spectroscopic measuring device of claim 15, wherein the one or more photonic devices include reflection-based photonic device having a plurality of partially-reflective layers of a reflectivity ranging between about 80%-90%.

19. The spectroscopic measuring device of claim 18, wherein the one or more reflection-based photonic devices are implemented in series.

20. The spectroscopic measuring device of claim 15, further comprising a display device configured to display graphically the spectral distribution of the spectral signal.

* * * * *